(12) United States Patent
Mohan et al.

(10) Patent No.: US 9,740,807 B2
(45) Date of Patent: Aug. 22, 2017

(54) METHOD TO MEASURE EDGE-RATE TIMING PENALTY OF DIGITAL INTEGRATED CIRCUITS

(71) Applicant: Cavium, Inc., San Jose, CA (US)

(72) Inventors: Nitin Mohan, Northborough, MA (US); Vasudevan Kandadi, Southborough, MA (US)

(73) Assignee: Cavium, Inc., San Jose, CA (US)

( * ) Notice: Subject to any disclaimer, the term of this patent is extended or adjusted under 35 U.S.C. 154(b) by 200 days.

(21) Appl. No.: 14/609,164

(22) Filed: Jan. 29, 2015

(65) Prior Publication Data
US 2016/0140272 A1      May 19, 2016

Related U.S. Application Data

(60) Provisional application No. 62/080,113, filed on Nov. 14, 2014.

(51) Int. Cl.
*G06F 17/50* (2006.01)

(52) U.S. Cl.
CPC .............................. *G06F 17/5031* (2013.01)

(58) Field of Classification Search
CPC ..................... G06F 17/5031; G06F 17/5081
USPC ................................................... 716/108
See application file for complete search history.

(56) References Cited

U.S. PATENT DOCUMENTS

| | | | |
|---|---|---|---|
| 8,464,195 B1* | 6/2013 | Korobkov et al. | 716/113 |
| 8,543,954 B1* | 9/2013 | Keller et al. | 716/115 |
| 8,595,669 B1* | 11/2013 | Keller et al. | 716/115 |
| 2007/0001725 A1* | 1/2007 | Atha et al. | 327/172 |
| 2011/0055781 A1* | 3/2011 | Potkonjak | 716/108 |

* cited by examiner

*Primary Examiner* — Suchin Parihar
(74) *Attorney, Agent, or Firm* — Wolf, Greenfield & Sacks, P.C.

(57) ABSTRACT

Methods for evaluating timing delays in unbalanced digital circuit elements and for correcting timing delays computed by static-timing models are described. Unbalanced circuit elements have large edge-rates at their input and small edge-rates at their output. Unbalanced circuit elements may be analyzed using a modified loaded ring oscillator. A statistical model and a fixed-corner model may be used to calculate timing delays associated with the unbalanced circuit elements and a timing delay error between the two models. The timing delay error may then be used to correct timing delays computed by static-timing models for similar unbalanced circuit elements within a more complex digital circuit.

26 Claims, 5 Drawing Sheets

METHOD TO MEASURE EDGE-RATE TIMING PENALTY OF DIGITAL INTEGRATED CIRCUITS

RELATED APPLICATIONS

This application claims priority under 35 U.S.C. §119(e) to U.S. Provisional Application Ser. No. 62/080,113, filed Nov. 14, 2014, and entitled "Method to Measure Edge-Rate Timing Penalty of Digital Integrated Circuits."

BACKGROUND

Technical Field

The technology relates to methods for analyzing timing delays in digital integrated circuits.

Discussion of the Related Art

Design and evaluation of high-performance, digital integrated circuits typically involves numerical simulation of transistor performance and logic element switching speeds, or edge-rates, in complex circuits. Often, simpler circuits such as a ring oscillator 100 depicted in FIG. 1A are simulated and/or fabricated to gain a basic understanding of a transistor's, or logic element's, edge-rate performance. Knowledge gained from a circuit element's performance in a ring oscillator can be used in models that incorporate the circuit element in more complex digital circuits, such as microprocessors.

A simple ring oscillator may include an odd number of inverters 105 connected in a loop as depicted in the drawing. For such an oscillator having m identical inverters, where m is an odd positive integer, the oscillation frequency f is related to the timing delay dT introduced by each inverter according to the following relation.

$$f = \frac{1}{2mdT}$$

In general, timing delay introduced by a digital circuit element can depend upon gate or diffusion capacitances within the element, and also on loading of the element. A circuit element may be loaded in several ways. One type of loading is "fan-out," where a single element may drive a plurality of circuit elements at its output. Another type of loading may be simple resistive loading due to long interconnects, for example. Conventionally, effects of loading can also be tested and simulated using ring oscillators in which circuit elements are loaded at each delay stage, as depicted in FIG. 1B. A loaded ring oscillator 102 may include m delay stages 111-119, and each delay stage may comprise a circuit element having its output loaded by more than one element.

For example, a delay-stage circuit 120 may comprise a first circuit element (inverter 103) in the loop path that is arranged in a fan-out configuration to drive N circuit elements (e.g., inverters 105). The multiplying symbol 122 represents the number of following circuit elements (inverter 105) that are driven in parallel by the previous circuit element (inverter 103). N may be any positive integer value that may be representative of a configuration used for the circuit element in a digital circuit that is being designed. For example, if an inverter is configured to drive 10 logic elements in a circuit under design, then N may be 10. In some cases, N may be 2, 5, 10, 15, 20, . . . 60 or higher values.

For the loaded oscillator 102 depicted in FIG. 1B, every circuit element along the loop path (e.g., inverters 103, 105) will drive an equivalent number N of circuit elements at their outputs. Accordingly, there is an "edge-rate balance" across each circuit element along the loop path. That is, there is a large edge-rate at the input and at the output of each circuit element along the loop path.

The loading of a circuit element adds a "timing penalty" or "timing error" to the circuit element. For example, the circuit element's nominal timing delay dT may be increased by an amount δ due to the loading: dT→dT+δ. The value of δ may depend upon the amount of loading. Conventionally, timing errors for loaded circuit elements are determined using a loaded ring oscillator 102, as depicted in FIG. 1B. The timing delays may be calculated from numerical simulations, and verified by fabrication of the oscillator and subsequent measurement of the circuit's performance.

SUMMARY

The inventors have discovered and appreciated that two types of numerical models (statistical and fixed-corner simulators) are reasonably accurate and in good agreement when computing timing delays for circuit elements arranged in conventional, loaded ring oscillators, but that these models diverge when a loaded circuit element is followed by an unloaded or lightly loaded circuit element. In such cases, there is an "edge-rate imbalance" across the unloaded or lightly loaded circuit element. The inventors have conceived of methods for calculating a timing delay error between the two models for circuit elements having unbalanced edge-rates, and using the timing delay error to correct static-timing models that are used to analyze and design complex digital integrated circuits containing similar unbalanced circuit elements.

According to some embodiments, a method for improving the accuracy of a static-timing circuit model that is used to model digital integrated circuits may comprise acts of evaluating a first timing delay of a first circuit element in a ring oscillator circuit using a statistical model. The first circuit element may be arranged in the ring oscillator to have a large edge-rate at its input and a small edge-rate at its output. A method may further include evaluating a second timing delay of the first circuit element using a fixed-corner model, and calculating a timing delay error between the first timing delay and the second timing delay. A method for improving the accuracy of a static-timing circuit model may also include correcting a computed timing delay determined by the static-timing circuit model for a second circuit element in an analyzed digital integrated circuit by an amount based on the determined timing delay error.

In some embodiments, the technology may be implemented as a manufactured data-storage device containing machine-readable instructions that, when executed by at least one processor, adapt an instrument controlled by the at least one processor to evaluate a first timing delay of a first circuit element in a ring oscillator circuit using a statistical model, and evaluate a second timing delay of the first circuit element using a fixed-corner model. The data-storage device may further include instructions that adapt the instrument to calculate a timing delay error between the first timing delay and the second timing delay, and correct a computed timing delay determined by the static-timing circuit model for a second circuit element in an analyzed digital integrated circuit by an amount based on the determined timing delay error.

In some aspects, a method for improving the accuracy of a static-timing circuit model further comprises evaluating timing delays in the analyzed digital integrated circuit with the static timing circuit model. In some implementations, the statistical model is a Monte Carlo circuit model. According to some aspects, the first circuit element is a logic device. In some aspects, the second circuit element is a logic device of the same type and unbalanced configuration as the first circuit element. In some implementations, the second circuit element is a logic device of a different type from the first circuit element and is in a same unbalanced configuration as the first circuit element.

According to some implementations, calculating the timing delay error comprises calculating a difference between the first timing delay and the second timing delay. In some aspects, correcting the computed timing delay comprises adding or subtracting the timing delay error from the computed timing delay determined by the static-timing circuit model for the second circuit element. In some implementations, calculating the timing delay error comprises calculating a ratio of the first timing delay and the second timing delay.

In some aspects, a method for improving the accuracy of a static-timing circuit model comprises comparing the calculated timing delay error or corrected computed timing delay against an experimentally-measured value of timing delay for a third circuit element arranged in an integrated-circuit ring oscillator. In some implementations, a method further comprises changing the value of the calculated timing delay error or corrected computed timing delay based on the comparison.

In some implementations of a method for improving the accuracy of a static-timing circuit model, the first circuit element is arranged in a fan-out structure of up to 60 circuit elements.

In some aspects, a method further comprises identifying, in the analyzed digital integrated circuit, one or more circuit elements including the second circuit element to have a large edge-rate at an input and a small edge-rate at an output. According to some implementations, the identifying is done automatically by the static-timing circuit model.

In some embodiments, a method for improving the accuracy of a static-timing circuit model that is used to model digital integrated circuits comprises acts of identifying, in a digital integrated circuit, a first circuit element having an unbalanced edge-rate between the first circuit element's input and output, and computing, with a static-timing circuit model, a timing delay for the first circuit element. A method may further include retrieving from a data store a timing delay error that is representative of a difference between a first timing delay computed using a statistical model for a second circuit element having a same unbalanced edge-rate in a ring oscillator circuit and a second timing delay computed using a fixed-corner model. A method may additionally include correcting the timing delay computed with the static-timing circuit model based on the retrieved timing delay error.

In some embodiments, the technology may be implemented as a manufactured data-storage device containing machine-readable instructions that, when executed by at least one processor, adapt an instrument controlled by the at least one processor to identify, in a digital integrated circuit, a first circuit element having an unbalanced edge-rate between the first circuit element's input and output, and compute, with a static-timing circuit model, a timing delay for the first circuit element. The data-storage device may further include instructions to adapt the instrument to retrieve from a data store a timing delay error that is representative of a difference between a first timing delay computed using a statistical model for a second circuit element having a same unbalanced edge-rate in a ring oscillator circuit and a second timing delay computed using a fixed-corner model, and to correct the timing delay computed with the static-timing circuit model based on the retrieved timing delay error.

In some implementations, the correcting of the timing delay comprises adding or subtracting the timing delay error to the computed timing delay. In some aspects, the identifying is done automatically by the static-timing circuit model.

According to some implementations, a method for improving the accuracy of a static-timing circuit model may further comprise identifying, in the digital integrated circuit, additional circuit elements having unbalanced edge-rates between their respective inputs and outputs. In some aspects, the data store is in the form of a look-up table that stores timing delay errors associated with different levels of unbalanced edge-rates for circuit elements. In some implementations, a method for improving the accuracy of a static-timing circuit model may further comprise simulating, with the static-timing model, operation of the digital integrated circuit using the corrected timing delay.

Any of the foregoing aspects and implementations may be combined in any suitable manner in an embodiment of a method for improving the accuracy of a static-timing circuit model.

The foregoing and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated, simplified, and/or enlarged to facilitate an understanding of the embodiments. In the drawings, like reference characters generally refer to like features, functionally similar and/or structurally similar elements throughout the various figures. The drawings are not necessarily to scale, emphasis instead being placed upon illustrating the principles of the teachings. The drawings are not intended to limit the scope of the present teachings in any way.

The features and advantages of the embodiments will become more apparent from the detailed description set forth below when taken in conjunction with the drawings.

DETAILED DESCRIPTION

Modern VLSI systems such as digital processors contain billions of transistors on a chip. Manufacturing such complex chips in volume production requires sufficient design margin so that a large fraction of the chips yield within the functional specifications required by end users. To aid design of such complex chips, many foundries provide Monte Carlo models that can simulate statistical distributions of transistors' electrical characteristics. Although these models can be accurate, the Monte Carlo analysis can be prohibitively slow for even moderately large circuits. As a result, chip designers often use less accurate, foundry-supplied fixed-corner models, such as a fixed-corner SPICE model. Typically, the fixed-corner models employ fixed and conservative bounds in place of the statistical distributions of the device characteristics used in statistical models.

Figure 1A:
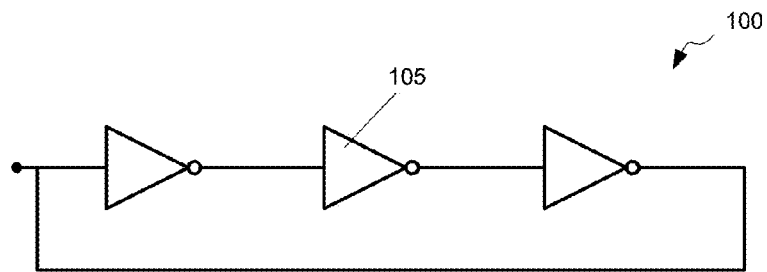
FIG. 1A is a schematic representative of a ring oscillator having three inverters.
Figure 1B:
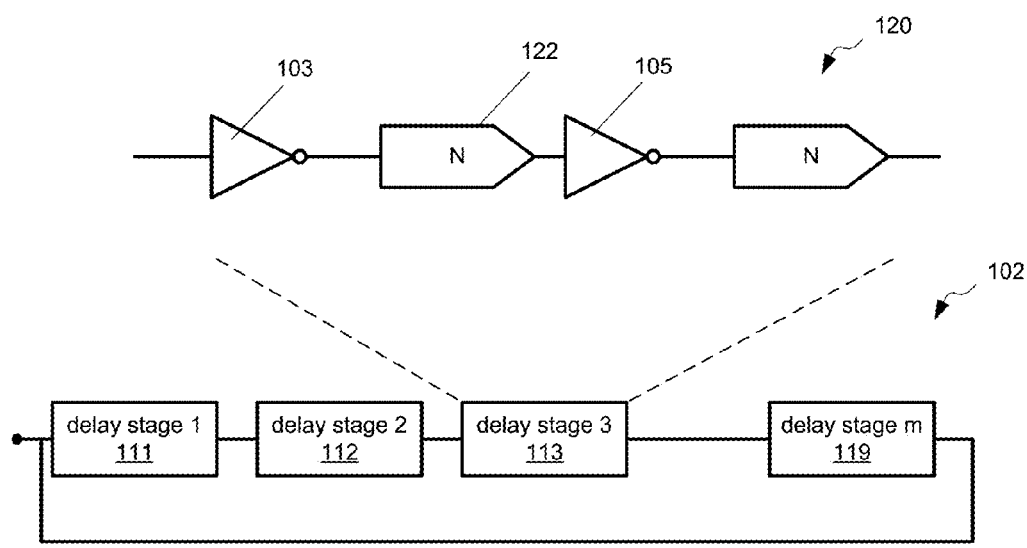
FIG. 1B is a schematic representative of a loaded ring oscillator that may be used to evaluate circuit elements arranged in fan-out or loaded configurations.

The inventors have discovered and appreciated that fixed-corner models can accurately track statistical models for well-behaved circuits, such as circuits containing edge-rate-balanced circuit elements and/or circuit elements transitioning from a small edge-rate at its input to a larger edge-rate at its output. This agreement for well-behaved circuits was determined by analyzing ring oscillators in which the fan-out was the same at each circuit element. For example, each inverter was arranged to drive a same number of N inverters, as depicted in FIG. 1B. Fan-outs were varied from 5 to 60, and an equal number used at each stage. Under these conditions, fixed-corner SPICE models, for example, were found to agree with Monte Carlo simulations.

The inventors have also discovered and appreciated that fixed-corner models are overly optimistic in computing timing delays for circuit elements having unbalanced edge-rates that transition from a large edge-rate at their input to a smaller edge-rate at their output. Discrepancies were observed in the computed timing delays between the statistical model and fixed-corner model when a circuit element having a large fan-out was followed by a circuit element having a smaller fan-out. Further, the discrepancies increased as the disparity in fan-out (and resulting edge-rate) increased, and the discrepancies in timing delays were observed in both slow and fast process corner models. As a result, any static-timing model that may be used to analyze a digital circuit having unbalanced circuit elements may give inaccurate timing delay results, which could be detrimental to a final chip design.

To improve the accuracy of static-timing analysis tools, the inventors have developed techniques and methods for correcting computations of static-timing tools that are used to analyze circuits having circuit elements with unbalanced fan-outs or edge-rates. In various embodiments, modified loaded ring oscillators are analyzed using both a Monte Carlo model and a fixed-corner model. Each model may compute a timing delay for a particular circuit element under test. The difference in computed timing delays (also referred to as a "timing delay error") may then be stored for later use in a static-timing model that is employed to analyze a more complex digital circuit in which a circuit element is arranged like the particular circuit element under test. The timing delay error may then be used to correct a timing delay for the circuit element that is computed by the static-timing model.

Figure 2A:
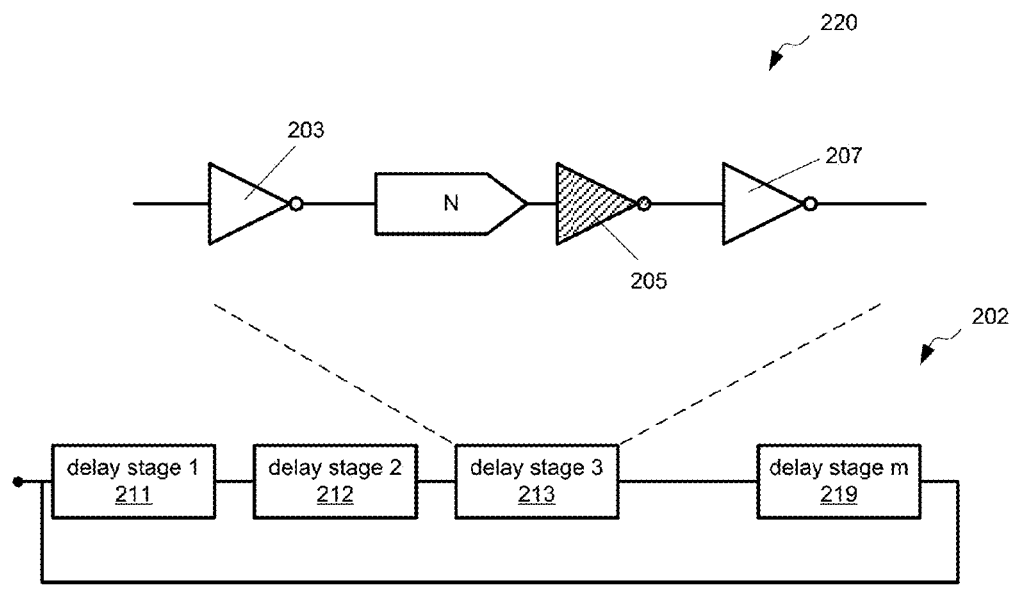
FIG. 2A depicts a ring oscillator that may be used to evaluate timing delay for a circuit element having a large edge-rate at its input and a small edge-rate at its output, according to some embodiments.

FIG. 2A depicts a modified loaded ring oscillator 202 comprising a number m of delay stages 211-219 that can be analyzed to determine timing delay errors for unbalanced circuit elements. A delay circuit 220 for each delay stage may be configured as shown in the drawing. The delay circuit may comprise a first circuit element 203 (e.g., an inverter) that is loaded at its output by N circuit elements 205 (e.g., N inverters driven in parallel). The loaded first circuit element 203 may be followed by an unloaded second circuit element 205 or circuit element that is loaded to a lesser degree. For the example shown, the second circuit element 205 may be any suitable circuit element that is under test.

Because the first circuit element 203 has a loaded output (N fan-out), there may be a large edge-rate associated with the output of the first circuit element 203. This large edge-rate appears at the input of the second circuit element 205 under test. In the example shown, the second circuit element 205 has a loading of N=1. It drives only one output inverter 207. Accordingly, there may be a small edge-rate at the output of the second circuit element. The second circuit element 205, the device under test, is then unbalanced. It has a large-edge rate at its input and a small edge-rate at its output.

Although FIG. 2A depicts only inverters, other logic elements may be incorporated in a delay stage in other embodiments. In some implementations, a delay stage may comprise a large edge-rate associated with a long length of wiring at an input to a logic element and a small edge-rate at an output of the element that may be associated with a short length of wiring. A characteristic of an unbalanced circuit element is that the output from the element in the delay stage have a smaller edge-rate (faster response) than its input edge-rate. Each delay stage may contain more elements than depicted in the delay circuit 220, according to some embodiments. For example, each delay stage may contain multiple fan-out stages, each followed by a same lightly loaded element.

Figure 2B:
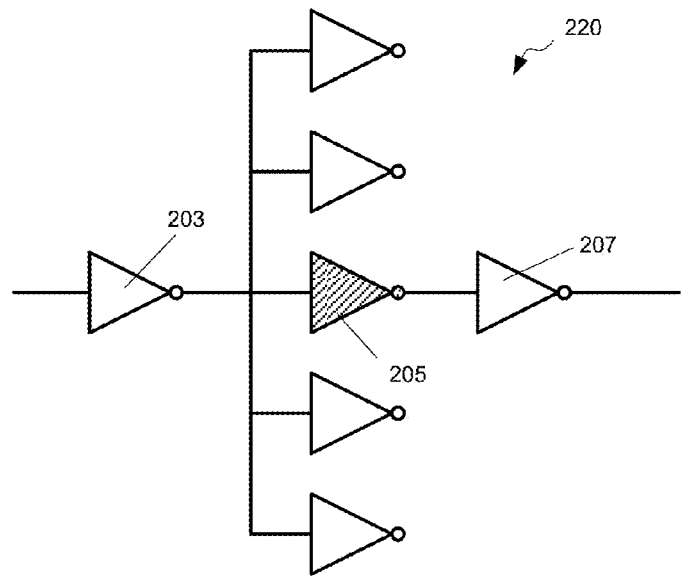
FIG. 2B depicts a delay stage of the ring oscillator of FIG. 2A, according to some embodiments.

FIG. 2B depicts just one example of a circuit schematic for the delay circuit 220 where N=5, according to some embodiments. As shown in the drawing, a first inverter 203 is loaded by 5 inverters at its output. A second inverter under test 205 is in the loop circuit path of the ring oscillator 202. The other inverters that load the output of the first circuit element 203 may, or may not, be loaded at their outputs. The output of the inverter under test 205 drives a single output inverter 207. Such a circuit arrangement may be used to simulate a logic circuit element in a more complex integrated circuit, where the logic circuit element is driven in parallel with four other logic elements and drives a single logic element at its output.

The modified ring oscillator 202 depicted in FIG. 2A, may be analyzed using a statistical model to determine a timing delay for the second circuit element 205. For example, a Monte Carlo model may be used to compute a first timing delay $\delta_{si}$ for the second circuit element 205. One example of a statistical model is a Monte Carlo transistor-level SPICE model. Additionally, a fixed-corner model (e.g., a fixed-corner SPICE model) may be used to compute a second timing delay $\delta_{fi}$ for the same circuit element 205. Examples of fixed-corner models include, but are not limited to SS, FF, TT, SSF, and FFF fixed-corner SPICE models for integrated circuits. According to some embodiments, a difference between the two calculated timing delays may be computed as the timing delay error $\Delta_i$.

$$\Delta_i = \delta_{fi} - \delta_{si} \quad (1)$$

The timing delay error may be stored in association with an identifier for the circuit configuration for the second circuit element under test 205. The identifier may be any suitable value and may indicate an extent of imbalance across the second circuit element 205. In some embodiments, the identifier may further indicate the type of circuit element (e.g., inverter, AND gate, NOR gate, NAND gate, etc.) Timing delay errors $\Delta_i$ may be computed for a number of different unbalanced circuit elements and circuit configurations, and each stored in association with identifiers for the unbalanced circuit elements. In some cases, timing delay errors computed for inverters may be used for other circuit elements (e.g., AND gate, NOR gate, NAND gate, etc.) In some embodiments, timing delay errors may be stored in a look-up table format in digital memory.

During a design phase of a more complex integrated circuit (e.g., a circuit for a digital processor, FPGA, video processor, ASIC, etc.) the values of the timing delay errors $\Delta_i$ may be used to compensate timing delays $\delta_{STi}$ computed for the integrated circuit by a static-timing tool. An example of a static-timing tool is PrimeTime® available from Synopsis, Inc. of Mountain View, Calif. Other static-timing tools that may be suitable for implementing timing delay corrections include, but are not limited to, NanoTime®, EinsTimer®, Encounter Timing System® static timing analysis tools. For example, a more complex circuit may include one or more unbalanced circuit elements within the circuit. After the timing delays $\delta_{STi}$ are computed for the unbalanced circuit elements within the circuit using a static-timing model, the computed timing delays $\delta_{STi}$ may then be corrected by an operation based on the timing delay errors $\Delta_i$ previously calculated. For example, a timing delay error $\Delta_i$ computed for a particular unbalanced circuit element as described above may be added to a timing delay $\delta_{STi}$ computed using a static-timing tool for a similarly configured unbalanced circuit element in the complex circuit.

$$\delta_{STi} \rightarrow \delta_{STi} + \Delta_i \quad (2)$$

Corrections for computed timing delays $\delta_{STi}$ (calculated with a static-timing tool) may then be applied, stage-by-stage through each timing path in the complex circuit. After the timing delays have been corrected, the static-timing model may be executed to evaluate the overall performance of the complex circuit.

In some embodiments, a static-timing model may be modified to automatically identify each unbalanced circuit element in a circuit and to apply timing delay corrections. For example, software code of a static-timing tool may be modified to include routines that search for unbalanced circuit elements in a circuit to be analyzed. When unbalanced circuit elements are identified, timing delay corrections may be applied to these circuit elements by referencing a look-up table that includes timing delay errors $\Delta_i$ for similarly configured circuit elements, for example.

Figure 3A:
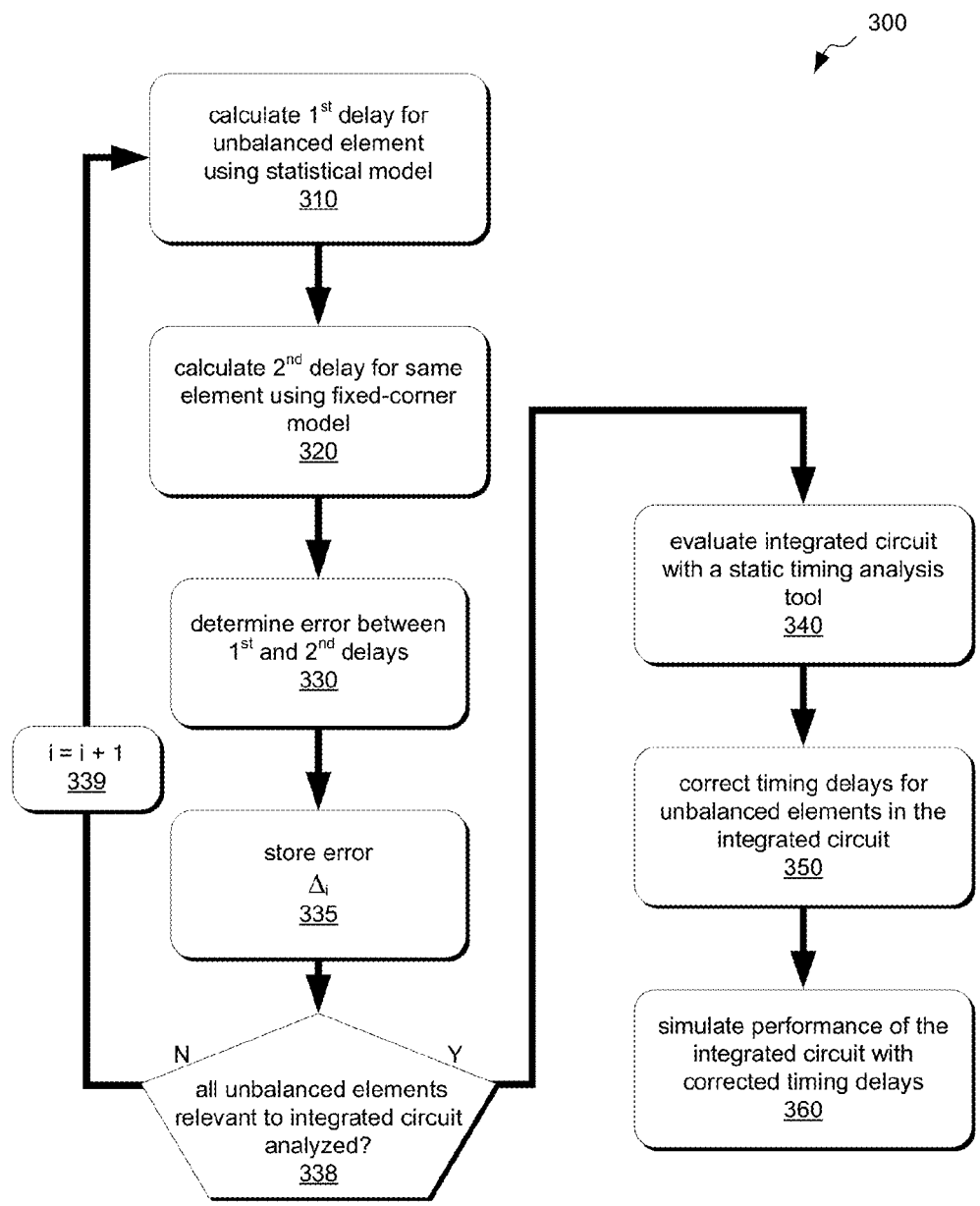
FIG. 3A depicts a method for correcting a static-timing model of a digital integrated circuit, according to some embodiments.

An example of a method 300 for improving the accuracy of static-timing models is depicted in FIG. 3A, according to some embodiments. A method may begin by calculating 310 a first timing delay $\delta_{si}$ for a first unbalanced circuit element in a modified ring oscillator circuit using a statistical model. The statistical model may comprise a Monte Carlo transistor-level SPICE simulation that is applied to the ring oscillator circuit. The method 300 may further comprise calculating 320 a second timing delay $\delta_{fi}$ for the first unbalanced circuit element in the same modified ring oscillator circuit using a fixed-corner model. The fixed-corner model may comprise any one of the fixed-corner SPICE models referenced above, according to some embodiments.

A method for improving the accuracy of static-timing models may include determining 330 a timing delay error $\Delta_i$ from the first and second calculated timing delays. In some embodiments, the timing delay error $\Delta_i$ may comprise a difference between the first and second calculated timing delays. In some embodiments, the timing delay error $\Delta_i$ may comprise a ratio of the first and second timing delays. The method may further comprise storing 335 the timing delay error $\Delta_i$. The timing delay error may be stored in a digital database, e.g., in a look-up table in association with the type of circuit element and level of unbalance of the circuit element.

According to some embodiments, a method 300 may include determining 338 whether all configurations of unbalanced circuit elements that may be used in an integrated circuit under design have been analyzed for timing delay errors. Different configurations may include different levels of unbalance and may comprise a range of allowable input edge-rate values and output edge-rate values for a circuit element under test. If all configurations have not been analyzed, the method 300 may return to a step of calculating 310 a first timing delay for a next unbalanced circuit configuration. A counter i that is used to index different timing delay errors may be incremented 339 for each computation of timing delay error.

After all timing delay errors have been determined for various unbalanced circuit elements and configurations, a method of improving the accuracy of a static-timing model may comprise analyzing 340 a digital integrated circuit using the static-timing model. Any suitable static-timing model may be used to compute delays associated with circuit elements and/or stages within the digital integrated circuit. The static-timing model may generate a record of computed timing delays $\delta_{STi}$ for some or all of the elements in the integrated circuit.

According to some embodiments, timing delays $\delta_{STi}$ computed with the static-timing model may be corrected 350 by the timing delay errors $\Delta_i$ previously calculated. According to some embodiments, a timing delay $\delta_{STi}$ computed for a particular element with a static-timing model may be adjusted by a corresponding timing delay error $\Delta_i$ computed for a same or similar circuit element configured with a same level of unbalance. A timing delay error $\Delta_i$ may be added to a timing delay $\delta_{STi}$ as indicated by EQ. 2, in some embodiments. In some implementations, a timing delay error $\Delta_i$ may be subtracted from a timing delay $\delta_{STi}$. In some implementations a timing delay computed by a static-timing model may be multiplied by a value determined from a ratio of the first and second timing delays $\delta_{si}$, $\delta_{fi}$ that were computed from the statistical model and the fixed-corner model, respectively.

Once the timing delays of the static-timing model have been corrected, the static-timing model may be used to simulate 360 operation of the integrated circuit. For example, corrected timing delays may be used for any unbalanced circuit elements in the circuit paths, and digital signals may be propagated through critical and/or all timing paths in the integrated circuit to verify proper operation of the integrated circuit.

Figure 3B:
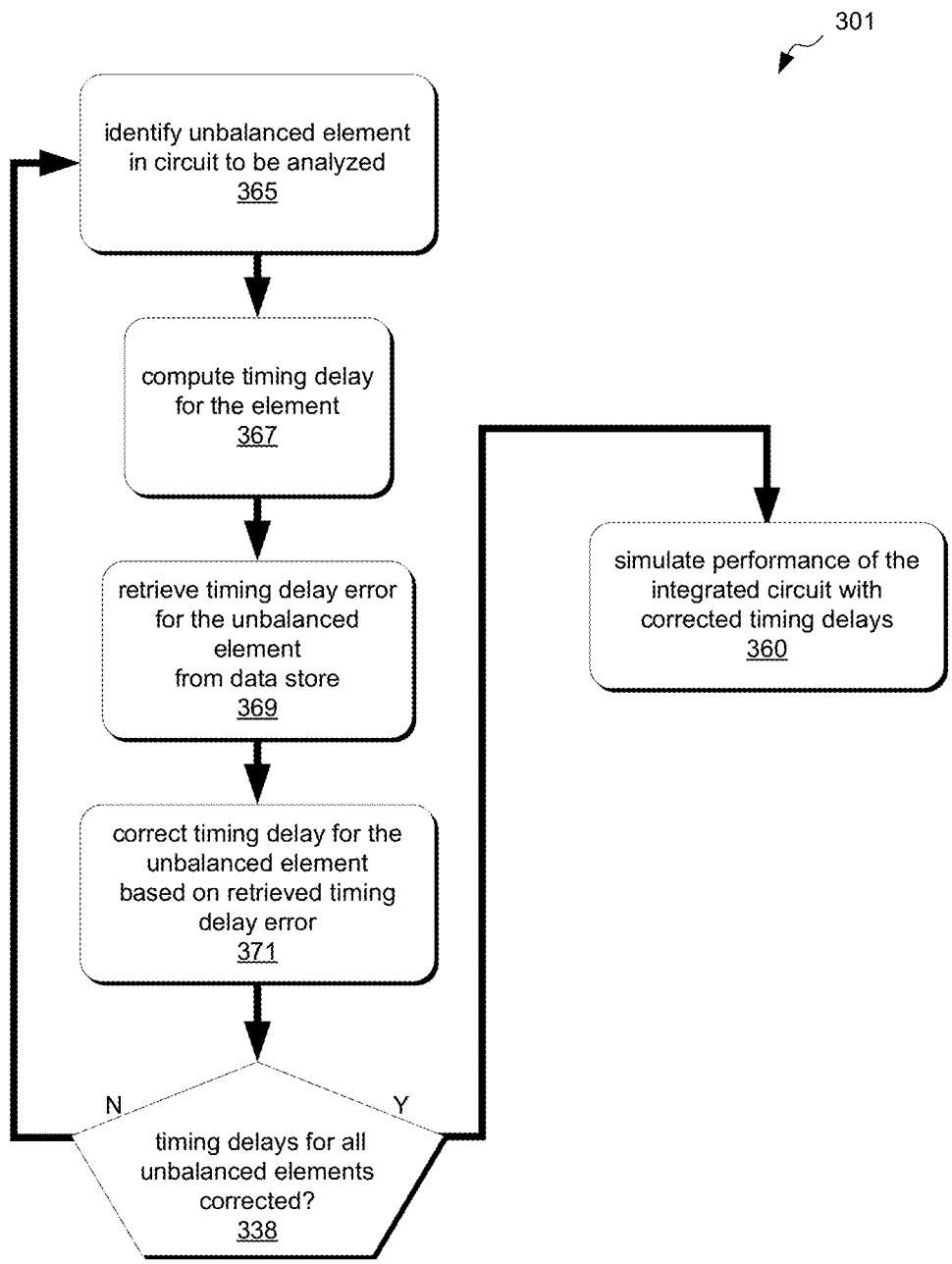
FIG. 3B depicts a method for correcting a static-timing model of a digital integrated circuit, according to some embodiments.

FIG. 3B depicts another embodiment of a method 301 for improving the accuracy of a static-timing tool that is used to analyze digital integrated circuits. According to some embodiments, a method may comprise identifying 365, in a digital integrated circuit to be analyzed, at least a first circuit element having an unbalanced edge-rate between the first circuit element's input and output. In some embodiments, the circuit may be identified automatically by the static-timing tool. For example, the static-timing tool may look for circuit elements arranged in fan-out configurations and determine whether the circuit element drives fewer circuit elements at its output than the number of elements in the fan-out arrangement including the circuit element.

The method 301 may further include computing 367, with the static-timing circuit model, a timing delay for the first circuit element. Any suitable static-timing circuit model (identified above) may be used to compute the timing delay. The method may also comprise retrieving 369 from a data store a timing delay error that is representative of a difference between a first timing delay computed using a statistical model for a second circuit element having a same unbalanced edge-rate in a ring oscillator circuit and a second timing delay computed using a fixed-corner model. The data store may be in the form of a look-up table stored in computer memory. The method may also comprise correcting 371 the timing delay computed with the static-timing circuit model based on the retrieved timing delay error (e.g., adding or subtracting the timing delay error, or multiplying the computed timing delay by a value determined from a ratio of the first timing delay and second timing delay).

Acts of the method 301 related to identifying unbalanced circuit elements and correcting computed time delays for those circuit elements may be repeated for each unbalanced circuit element identified in a digital integrated circuit. When all timing delays for unbalanced circuit elements have been corrected, the method may include simulating 360 operation of the integrated circuit.

By improving the accuracy of static-timing models, the amount of edge-rate cleanup work during integrated circuit design may be reduced. For example, the number of timing paths that do not have sufficient timing margins may be reduced through analysis with the more accurate static-timing model, and only the timing paths that do not have sufficient timing margins may need to be redesigned. In addition, a more accurate static-timing model may highlight timing paths that are barely passing (before adjustment), but have large edge-rates. If these marginal paths are not redesigned, they could reduce chip yield and/or performance, increasing manufacturing costs.

The correction of timing delays may be implemented in additional or alternative embodiments. For example, circuit designers often use software tools that help guide circuit design. Some of these tools use standardized libraries that catalog characteristics (e.g., set-up time, hold time, timing delay, etc.) for various types of standard circuit elements or standard cells (e.g., inverters, buffers, NAND gates, NOR gates, XOR gates, flip flops, latches, etc.) An example of a standardized library is currently known as a "Liberty" library. This library is an open source library available on-line, and contains timing characteristics for various circuit elements used in the integrated circuit industry.

Some circuit design software tools may be configured to use data imported from a standardized library, such as the Liberty library, as an aid to circuit designers. Some examples of circuit design tools include, but are not limited to, "Design Compiler Graphical®" and "IC Compiler" that are both available from Synopsis, Inc. of Mountain View, Calif.

At a design phase, the circuit design software tool may use the imported device characteristics to predict performance of a circuit or portion of a circuit. For example, the software tool may predict timing bottlenecks or circuit congestion. By identifying these early in a design phase, circuits can be reconfigured early and more readily than later in a design phase where reconfiguration may become a more complicated and time-consuming task.

According to some embodiments, corrected timing delays computed by the processes described above for circuit elements having unbalanced edge-rates may be provided to a standardized library and subsequently used early in a design phase of an integrated circuit using any suitable circuit design software tool. For example, a circuit design software tool may be configured to select conventional timing data from a standardized library for a circuit element having a balanced configuration or heavier loading at its output. The circuit design software tool may also be configured to select corrected timing data, from the standardized library or another data source, for a circuit element having an unbalanced edge-rate, e.g., lighter loading at its output. By using corrected timing data early in a design phase, a circuit design software tool may more accurately predict performance of a circuit. This can result in fewer failures of circuit paths and less reconfiguration or clean-up work later in development of an integrated circuit.

As may be appreciated, the creation and use of computational tools to calculate and use corrected timing data for circuit elements having unbalanced edge rates can improve development and manufacturing of integrated circuits compared to conventional circuit analysis techniques. For example, the use of corrected timing data in circuit analysis and circuit design software tools can reduce the cost of, and improve the quality of results for, manufactured integrated circuits.

In some embodiments, timing delay errors $\Delta_i$ for various types of circuit elements (e.g., NAND gates, OR gates, AND gates, etc.) may be computed based on the analysis of inverters only. For example, ring oscillators containing unbalanced configurations for inverters as depicted in FIG. 2B may be analyzed, and the results used for the various types of circuit elements. In some implementations, timing delay errors $\Delta_i$ may be computed based on the analysis of a particular type of gate. For example, a NAND gate may be configured as an inverter and simulated in a ring oscillator circuit to calculate timing delay errors for NAND gates under various unbalanced configurations. These timing delay errors may then be applied specifically to NAND gates.

Computed timing delay errors $\Delta_i$ may be validated and/or corrected by comparison with values measured for ring oscillators that are fabricated in a semiconductor integrated circuit. For example, test ring oscillator circuits may be fabricated to have similar levels of unbalance at circuit elements in the ring oscillator as will be implemented in a more complex circuit under development. Timing delay errors A, may be measured for the fabricated circuit and compared against results from numerical simulations of similar ring oscillator circuits. The experimentally-measured results may be used to correct the numerically-calculated timing delay error.

Figure 4:
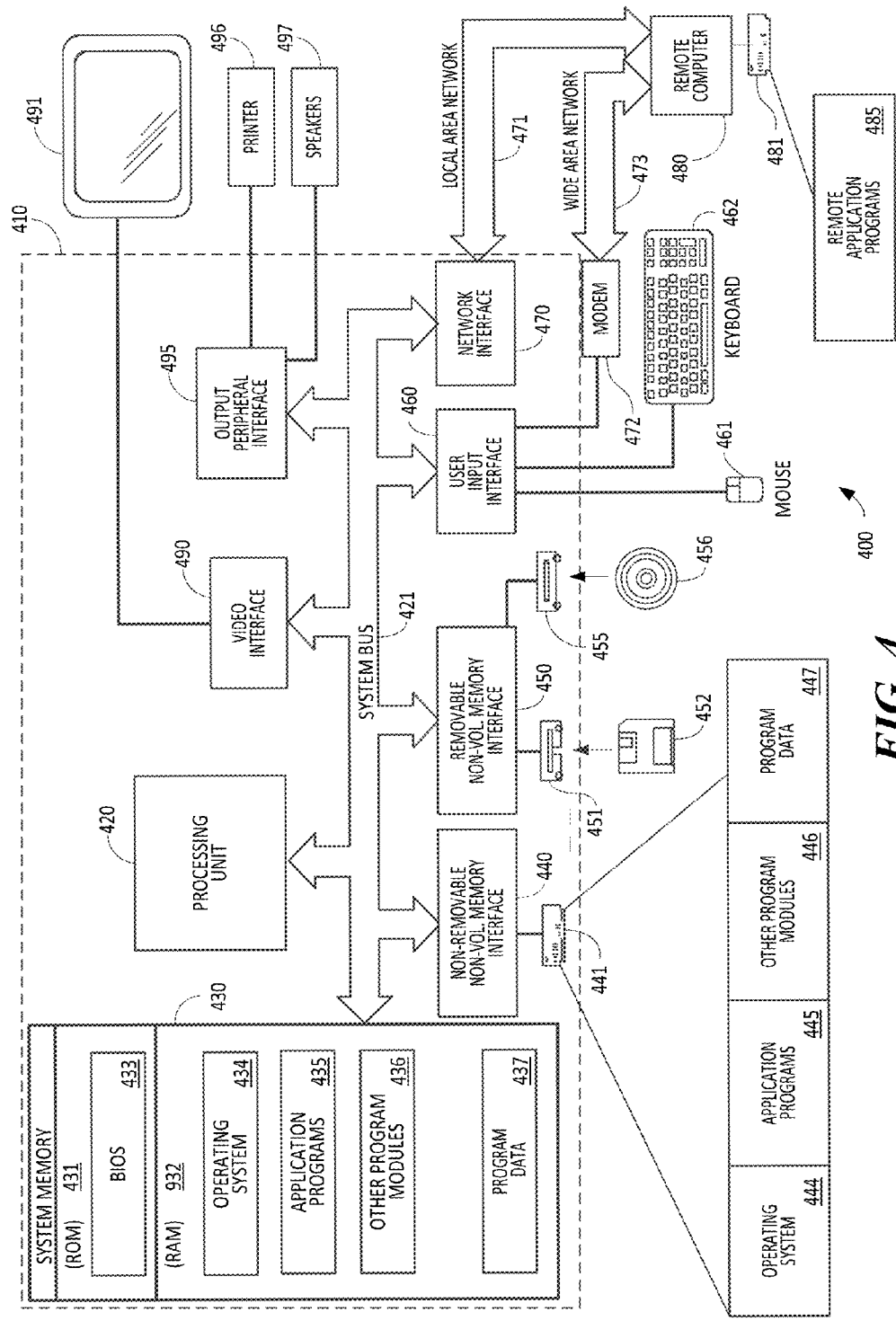
FIG. 4 depicts a computing system that may be adapted to implement acts of methods for correcting a static-timing model of a digital integrated circuit, according to some embodiments.

FIG. 4 depicts components of a computing device that may be adapted for implementing and improving a static-timing model of an integrated circuit. The computing device may also be used to analyze ring oscillators using Monte Carlo models and fixed-corner models. Some or all of the components shown may be present in some embodiments. In a distributed computing environment, some components may be located on a server and some components may be located on a client device.

According to some implementations, a computing device for improving the accuracy of static-timing models of integrated circuits may include a computing device 410. Components of computing device 410 may include, but are not limited to, a processing unit 420, a memory 430, and a bus 421 that couples various components including the memory to the processing unit 420. The bus 421 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Computer 410 may include one or more types of machine-readable media. Machine-readable media can be any available media that can be accessed by computer 410 and includes both volatile and nonvolatile, manufactured storage media, removable and non-removable manufactured storage media. By way of example, and not limitation, machine-readable media may comprise information such as computer-readable instructions, data structures, program modules or other data. Machine-readable media includes, but is not limited to, RAM, ROM, EEPROM, flash memory or other memory-device technology, CD-ROM, digital versatile disks (DVD) or other optical disk storage, magnetic cassettes, magnetic tape, magnetic disk storage or other magnetic storage devices, or any other manufactured data-storage device which can be used to store the desired information and which can accessed by computer 410.

The memory 430 may include computer storage media in the form of volatile and/or nonvolatile memory such as read only memory (ROM) 431 and random access memory (RAM) 432. A basic input/output system 433 (BIOS), containing the basic routines that help to transfer information between elements within computer 410, such as during start-up, may be stored in ROM 431. RAM 432 may contain data and/or program modules that are immediately accessible to and/or presently being operated on by processing unit 420. By way of example, and not limitation, FIG. 4 illustrates an operating system 434, application programs 435, other program modules 436, and program data 437.

The computer 410 may also include other removable/non-removable, volatile/nonvolatile machine-readable media. By way of example only, FIG. 4 illustrates a hard disk drive 441 that reads from or writes to non-removable, nonvolatile magnetic media, a magnetic disk drive 451 that reads from or writes to a removable, nonvolatile magnetic disk 452, and an optical disk drive 455 that reads from or writes to a removable, nonvolatile optical disk 456 such as a CD ROM or other optical media. Other removable/non-removable, volatile/nonvolatile machine-readable media that can be used in the exemplary operating environment include, but are not limited to, magnetic tape cassettes, flash memory cards, digital versatile disks, digital video tape, solid state RAM, solid state ROM, and the like. The hard disk drive 441 may be connected to the system bus 421 through a non-removable memory interface such as interface 440, and magnetic disk drive 451 and optical disk drive 455 may be connected to the system bus 421 by a removable memory interface, such as interface 450.

The drives and their associated machine-readable media discussed above and illustrated in FIG. 4, provide storage of machine-readable instructions, data structures, program modules and other data for the computer 410. In FIG. 4, for example, hard disk drive 441 is illustrated as storing operating system 444, application programs 445, other program modules 446, and program data 447. These components may either be the same as, or different from, operating system 434, application programs 435, other program modules 436, and program data 437. Operating system 444, application programs 445, other program modules 446, and program data 447 are given different numbers here to illustrate that, at a minimum, they are different copies.

A user may enter commands and information into the computer 410 through input devices such as a keyboard 462 and pointing device 461, commonly referred to as a mouse, trackball or touch pad. Other input devices (not shown) may include a microphone, joystick, game pad, satellite dish, scanner, or the like. These and other input devices may be connected to the processing unit 420 through a user input interface 460 that is coupled to the system bus, but may be connected by other interface and bus structures, such as a parallel port, game port or a universal serial bus (USB). A monitor 491 or other type of display device may also be connected to the system bus 421 via an interface, such as a video interface 490. In addition to the monitor, a computing device 410 may also include other peripheral output devices such as speakers 497 and printer 496, which may be connected through a output peripheral interface 495.

The computer 410 may operate in a networked environment using connections to one or more remote devices, such as a remote computer 480. The remote computer 480 may be a personal computer, a server, a router, a network PC, a peer device or other common network node, and may include many or all of the elements described above relative to the computer 410, although only a memory storage device 481 has been illustrated in FIG. 4. The logical connections depicted in FIG. 4 include a local area network (LAN) 471 and a wide area network (WAN) 473, but may also include other networks. Such networking environments may be commonplace in offices, enterprise-wide computer networks, intranets and the Internet. Network connections may be wired, optical fiber based, or wireless.

When used in a LAN networking environment, the computer 410 may be connected to the LAN 471 through a network interface or adapter 470. When used in a WAN networking environment, the computer 410 may include a modem 472 or other means for establishing communications over the WAN 473, such as the Internet. The modem 472, which may be internal or external, may be connected to the system bus 421 via the user input interface 460, or other appropriate mechanism. In a networked environment, program modules depicted relative to the computer 410, or portions thereof, may be stored in a remote memory storage device. By way of example, and not limitation, FIG. 4 illustrates remote application programs 485 as residing on memory device 481. It will be appreciated that the network connections shown are exemplary and other means of establishing a communications link between the computers may be used.

The technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments. For example, in some implementations, a method for improving the accuracy of static-timing analysis tools may comprise acts of analyzing 340 a digital integrated circuit, correcting the computed timing delays $\delta_{STi}$, and simulating 360 operation of the integrated circuit. Steps associated with determining timing delay errors may be executed previously and the results (in the form of a data record) used to implement a method of improving the accuracy of a static-timing analysis tool.

The technology may also be embodied as machine-readable instructions stored on a data storage device. The machine-readable instructions, when executed by at least one processor, may adapt an instrument controlled by the at least one processor to execute one or more of the acts (described above) for improving the accuracy of a static-timing circuit model that is used to model digital integrated circuits. According to some embodiments, the technology may be implemented as machine-readable instructions that are included as part of a static-timing circuit model that is used to analyze integrated circuits. In some embodiments, the technology may be implemented as machine-readable instructions that are supplied as a supplementary software package to a static-timing circuit model.

The terms "approximately" or "about" may be used herein to refer to a value that is within ±5% of a target value in some embodiments, within ±10% of a target value in some embodiments, within ±20% of a target value in some embodiments, and yet within ±30% of a target value in some embodiments. When large ranges spanning at least three orders of magnitude are involved, these terms may be used to mean within a factor of two, or within an order of magnitude.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method for improving the accuracy of a static-timing circuit model that is used to model digital integrated circuits, the method comprising:
    evaluating a first timing delay of a first circuit element in a ring oscillator circuit using a statistical model implemented via execution of stored machine-readable instructions by at least one processor of a computing device, wherein the first circuit element is arranged in the ring oscillator to have a large edge-rate at its input and a small edge-rate at its output;
    evaluating a second timing delay of the first circuit element using a fixed-corner model implemented via execution of stored machine-readable instructions by at least one processor of a computing device;
    calculating a timing delay error between the first timing delay and the second timing delay; and
    correcting a computed timing delay determined by the static-timing circuit model for a second circuit element in an analyzed digital integrated circuit by an amount based on the determined timing delay error.

2. The method of claim 1, further comprising evaluating timing delays in the analyzed digital integrated circuit with the static timing circuit model.

3. The method of claim 1, wherein the statistical model is a Monte Carlo circuit model.

4. The method of claim 1, wherein the first circuit element is a logic device.

5. The method of claim 1, wherein the second circuit element is a logic device of the same type and unbalanced configuration as the first circuit element.

6. The method of claim 1, wherein the second circuit element is a logic device of a different type from the first circuit element and is in a same unbalanced configuration as the first circuit element.

7. The method of claim 1, wherein calculating the timing delay error comprises calculating a difference between the first timing delay and the second timing delay.

8. The method of claim 7, wherein correcting the computed timing delay comprises adding or subtracting the timing delay error from the computed timing delay determined by the static-timing circuit model for the second circuit element.

9. The method of claim 1, wherein calculating the timing delay error comprises calculating a ratio of the first timing delay and the second timing delay.

10. The method of claim 1, further comprising comparing the calculated timing delay error or corrected computed timing delay against an experimentally-measured value of timing delay for a third circuit element arranged in an integrated-circuit ring oscillator.

11. The method of claim 10, further comprising changing the value of the calculated timing delay error or corrected computed timing delay based on the comparison.

12. The method of claim 1, wherein the first circuit element is arranged in a fan-out structure of up to 60 circuit elements.

13. The method of claim 1, further comprising identifying, in the analyzed digital integrated circuit, one or more circuit elements including the second circuit element to have a large edge-rate at an input and a small edge-rate at an output.

14. The method of claim 13, wherein the identifying is done automatically by the static-timing circuit model.

15. A method for improving the accuracy of a static-timing circuit model that is used to model digital integrated circuits, the method comprising:
    identifying, in a digital integrated circuit, a first circuit element having an unbalanced edge-rate between the first circuit element's input and output;
    computing, with a static-timing circuit model implemented via execution of stored machine-readable instructions by at least one processor, a timing delay for the first circuit element;
    retrieving from a data store a timing delay error that is representative of a difference between a first timing delay computed using a statistical model for a second circuit element having a same unbalanced edge-rate in a ring oscillator circuit and a second timing delay computed using a fixed-corner model; and
    correcting the timing delay computed with the static-timing circuit model based on the retrieved timing delay error.

16. The method of claim 15, wherein the correcting comprises adding or subtracting the timing delay error to the computed timing delay.

17. The method of claim 15, wherein the identifying is done automatically by the static-timing circuit model.

18. The method of claim 15, further comprising identifying, in the digital integrated circuit, additional circuit elements having unbalanced edge-rates between their respective inputs and outputs.

19. The method of claim 15, wherein the data store is in the form of a look-up table that stores timing delay errors associated with different levels of unbalanced edge-rates for circuit elements.

20. The method of claim 15, further comprising simulating, with the static-timing model, operation of the digital integrated circuit using the corrected timing delay.

21. A non-transitory data-storage device comprising machine-readable instructions that, when executed by at least one processor implementing a static-timing circuit model that is used to model digital integrated circuits, adapts the at least one processor to execute acts of:
   identifying, in a digital integrated circuit, a first circuit element having an unbalanced edge-rate between the first circuit element's input and output;
   computing, with the static-timing circuit model implemented via execution of the machine-readable instructions by the at least one processor, a timing delay for the first circuit element;
   retrieving from a data store a timing delay error that is representative of a difference between a first timing delay computed using a statistical model for a second circuit element having a same unbalanced edge-rate in a ring oscillator circuit and a second timing delay computed using a fixed-corner model; and
   correcting the timing delay computed with the static-timing circuit model based on the retrieved timing delay error.

22. The non-transitory data-storage device of claim 21, wherein the correcting comprises adding or subtracting the timing delay error to the computed timing delay.

23. The non-transitory data-storage device of claim 21, wherein the identifying is done automatically by the static-timing circuit model.

24. The non-transitory data-storage device of claim 21, further comprising machine-readable instructions to adapt the at least one processor to execute an act of identifying, in the digital integrated circuit, additional circuit elements having unbalanced edge-rates between their respective inputs and outputs.

25. The non-transitory data-storage device of claim 21, wherein the data store is in the form of a look-up table that stores timing delay errors associated with different levels of unbalanced edge-rates for circuit elements.

26. The non-transitory data-storage device of claim 21, further comprising machine-readable instructions to adapt the at least one processor to execute an act of simulating, with the static-timing model, operation of the digital integrated circuit using the corrected timing delay.

* * * * *